United States Patent [19]

Hannan et al.

[11] 3,898,375

[45] Aug. 5, 1975

[54] NOTCH REJECTION FILTER

[75] Inventors: William James Hannan, Palm Beach Gardens; Robert Shelby Singleton, North Palm Beach, both of Fla.

[73] Assignee: RCA Corporation, New York, N.Y.

[22] Filed: Dec. 13, 1973

[21] Appl. No.: 424,319

[52] U.S. Cl. ................. 178/5.1; 325/132; 325/477; 328/167

[51] Int. Cl. ............................................. H04n 1/44

[58] Field of Search ...... 178/5.1, DIG. 13; 325/132, 325/308, 422, 477, 483, 490, 458; 328/167

[56] References Cited

UNITED STATES PATENTS

| | | | |
|---|---|---|---|
| 3,019,335 | 1/1962 | Brilliant | 325/483 |
| 3,347,982 | 10/1967 | Bass et al. | 178/5.1 |
| 3,835,399 | 9/1974 | Holmes | 328/167 |

*Primary Examiner*—Richard A. Farley
*Assistant Examiner*—S. C. Buczinski
*Attorney, Agent, or Firm*—Eugene M. Whitacre

[57] ABSTRACT

The filter is of a bridged-T construction, and includes a pair of semiconductor rectifiers in back-to-back relationship. An oscillation voltage is applied to the junction of the rectifiers to vary their reverse biases and the junction capacities they exhibit. The variations in notch frequency which result are selected to overlap possible drift in filter tuning and provide continued signal rejection in the presence of such changes.

7 Claims, 1 Drawing Figure

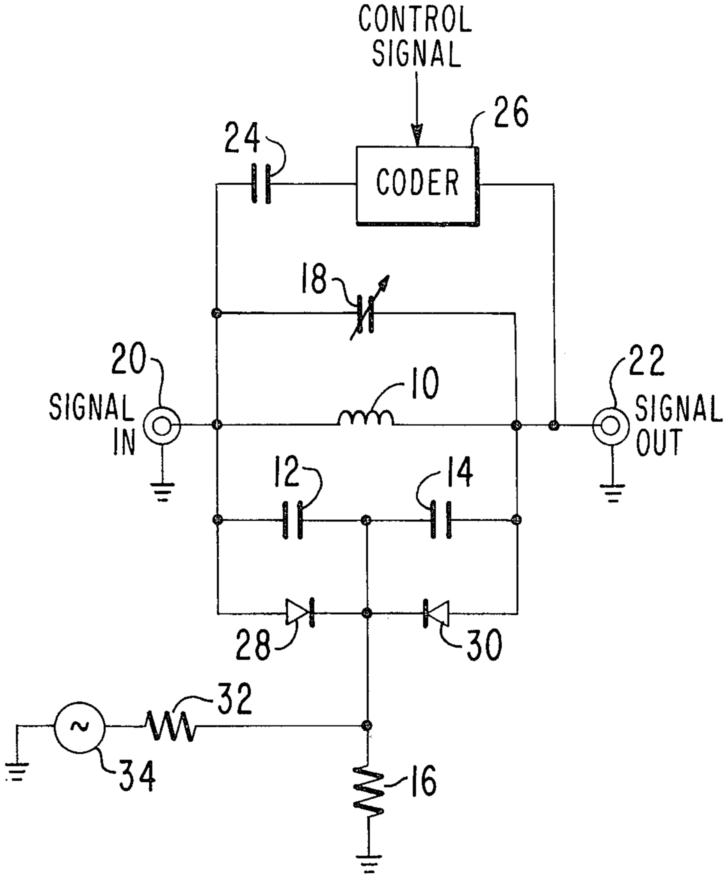
CONTROL SIGNAL
CODER
26
24
18
20
SIGNAL IN
10
22
SIGNAL OUT
12
14
28
30
32
34
16

NOTCH REJECTION FILTER

FIELD OF THE INVENTION

This invention relates to notch rejection filters and, more particularly, to a filter which exhibits a continuously variable rejection notch to alleviate critical tuning problems.

SUMMARY OF THE INVENTION

As will become clear hereinafter, the filter of the present invention is especially useful in pay television systems where simplicity and low cost in subscribed signal control is desired. Typical applications are in hotel and motel operations, where large numbers of filters would be needed to controllably provide subscribed signals to the many television receivers present. In accordance with one embodiment of the invention, a variable notch serves to reject signals so as to obviate the need for critical tuning. This construction provides a range of rejection frequencies, selected to overlap possible drifts in filter tuning which might otherwise enable the hotel guest to view a pay television program without first having to pay the required fee.

In the embodiment described below, a bridged-T network is employed, along with a pair of semiconductor rectifiers whose capacitance in part determines the input signal frequencies which will be rejected. The capacitances are, in turn, controlled by varying a reverse bias voltage coupled across the rectifiers, with the voltage source and the rectifier devices being selected to establish the range of frequencies over which applied input signals will be rejected.

BRIEF DESCRIPTION OF THE DRAWING

These and other features of the present invention will be more clearly understood from a consideration of the following description taken in connection with the accompanying drawing which shows a notch rejection filter constructed in accordance with the invention.

DETAILED DESCRIPTION OF THE DRAWING

The notch rejection filter of the drawing incorporates an inductor 10 across which a pair of capacitors 12, 14 are connected in series. A resistor 16 references the junction between capacitors 12, 14 to a point of ground potential, while a variable capacitor 18 is connected in shunt across the inductor 10 to tune the filter to the frequency of an incoming, subscribed signal. Such a signal may be provided from an external antenna system or from a video tape recorder, for example, and is applied to an input terminal 20 of the filter at the frequency of a television channel not in use in the geographical area where the pay television system is operating--e.g., channel 3 in New York City, at 61.25 MHz. After translation through the filter, the subscribed signal appears at the output terminal 22, for subsequent application to the antenna input terminals of a television receiver within the hotel room. A capacitor 24 is further included in series connection with a coding circuit 26 across inductor 10, to shift the frequency notch away from the incoming signal when the pay television signal has been subscribed for.

That is, in the operation of the circuit as so far described, the coder 26 holds the capacitor 24 out of the bridged-T filter so formed until its receipt of a control signal to the effect that a pay television program is to be reproduced by the room's receiver. Prior to receipt of that signal, the notch rejection frequency for the filter is determined by the values for the inductor 10, the capacitors 12 and 14 and the variable capacitor 18. In the absence of the control signal for the coder 26, these components establish a rejection frequency by which pay television signals applied at input terminal 20, for example at channel 3 frequency, will be blocked from reaching output terminal 22 and, therefore, will not be reproduced. On the other hand, when the control signal is received and recognized by the coder 26, the capacitor 24 will be inserted into the circuit, and will adjust the notch away from the 61.25 MHz frequency to enable the subscription signal to pass to output terminal 22.

As will be readily appreciated, the characteristics of the inductor 10 and the capacitors 12, 14 and 18 may so change over a period of time as to cause a drift in the notch rejection frequency. Were this to occur, the pay television program on channel 3 could pass the filter without the room occupant having first paid the subscription fee. To prevent this, prior filter circuit arrangements have been constructed for critical tuning but, in such respects, have been complex in their designs.

With the present invention, on the other hand, the accuracy of frequency rejection is maintained, without any substantial increase in complexity. To this end, the notch rejection filter of the drawing further includes a pair of semiconductor rectifiers 28, 30 connected in back-to-back relationship across the capacitors 12, 14. In particular, the rectifier 28 is coupled across the capacitor 12 while the rectifier 30 is coupled across the capacitor 14, the cathode electrodes of the two rectifier devices being joined at the common junction of the capacitors. A resistor 32 is additionally included to couple that junction to a source of oscillation voltages 34 which, in turn, is referenced to ground.

With these added elements, the notch rejection frequency of the filter becomes also a function of the capacitance exhibited by the rectifiers 28, 30. Because the junction capacitance depends upon the reverse bias voltage applied at the rectifier cathode electrodes, variation in that voltage can effectively sweep the notch over a range of frequencies. In this way, though it would be difficult to hold the notch at a particular frequency, by sweeping the rejection frequency back and forth around that point with a wide enough movement, the wobble imparted would still be sufficient to bring an applied subscription signal, at least a portion of the time, back into the range of frequencies blocked by the filter. Thus, though the drift in tuning due to component variations be such as to otherwise make it difficult to block a given signal frequency for an entire time interval, the described arrangement could keep it blocked a significant percentage of the time, sufficiently so to prevent the hotel room occupant from intelligently receiving the pay television broadcast. Upon receipt of the control signal indicating the payment for the subscription program, the coder 26 once again switches in the capacitor 24 to drop the notch frequency to a value which will enable the incoming information signal to pass.

While applicant does not wish to be limited to any particular set of values, the following have proved useful in one embodiment of the present invention operative with a channel 3 video carrier of 61.25 MHz frequency and producing rejection frequencies over a 100 kHz sweep range.

| Component | Value |
| --- | --- |
| Inductor 10 | 35 nanohenries |
| Capacitor 12 | 270 picofarads |
| Capacitor 14 | 270 picofarads |
| Capacitor 18 | 5–20 picofarads |
| Capacitor 24 | 100 picofarads |
| Resistor 16 | 110 ohms |
| Resistor 32 | 470 ohms |
| Rectifier 28 | 1N5140 |
| Rectifier 30 | 1N5140 |
| Oscillation source 34 | Type 555 integrated circuit chip manufactured by Signetics Company |

The oscillation source 34, in this arrangement, provided a one volt peak-to-peak signal and was operated at a frequency comparable to the horizontal scanning rate of the applied signal.

While there has been described what is considered to be a preferred embodiment of the present invention, it will be readily appreciated that modifications may be made without departing from the scope of the teachings herein. It will also be apparent that any suitable manner of coupling control signals to activate the coder 26 may be employed when pay television programs have been subscribed for. One such method might entail the use of a computer conditioned to enable the coder 26 in response to a telephone call placed from the hotel room requesting such subscription service. The computer, in this instance, may, at the same time, automatically add the charge for such service to the guest's bill.

What is claimed is:

1. A signal translating circuit comprising:

a frequency selective network tuned to block the passage of applied signals of a given frequency from an input terminal to an output terminal and to enable the passage of applied signals of other frequencies between said terminals; and first means for cyclically varying the frequency selectivity characteristics of said network to establish a range of signal frequencies to be blocked, including and around said given frequency, to thereby offset random variations in said selectivity characteristics otherwise tending to detune said network and permit the undesired translation of applied signals of said given frequency between said input and output terminals.

2. The signal translating circuit of claim 1 wherein said frequency selective network comprises inductive and capacitive components and wherein said first means varies the capacitive reactance within said network to continuously vary the signal frequency which said translating circuit would block at any one instant of time.

3. The signal translating circuit of claim 2 wherein said frequency selective network comprises an inductor coupled between said input and output terminals and a pair of capacitive components serially connected across said inductor to tune said network, and wherein said first means varies the effective capacitance exhibited by said capacitive components to continuously vary the tuning of said network and the signal frequencies to be blocked thereby.

4. The signal translating circuit of claim 3 wherein said pair of capacitive components comprises a pair of capacitors serially coupled between said input and output terminals and a pair of semiconductor rectifiers individually connected in opposite polarity direction across respective ones of said capacitors, and wherein said first means includes means for applying a continuously varying voltage to reverse bias each of said semiconductor rectifiers and to vary the capacitance characteristics exhibited thereby.

5. The signal translating circuit of claim 4 for use in blocking the passage of an applied television signal of said given frequency from said input terminal to said output terminal, further comprising second means for controllably varying the frequency selectivity characteristics of said network to enable the passage of even said television signal of said given frequency upon the receipt of a supplied control signal.

6. The signal translating circuit of claim 5 wherein said second means comprises a third capacitor serially connected with a switch means across said inductor, with said switch means being held in an open-circuit condition in the absence of said supplied control signal and being held in a closed-circuit condition in the presence of said supplied control signal, whereby said frequency selective network is detuned away from said given frequency upon the receipt of said control signal.

7. The signal translating circuit of claim 6 for use in a pay television system, wherein said control signal for said switch means is supplied when such television service is subscribed for.

* * * * *